United States Patent [19]
Hattori et al.

[11] Patent Number: 5,578,142
[45] Date of Patent: Nov. 26, 1996

[54] SOLAR-CELL MODULE AND PROCESS FOR PRODUCING THE SAME

[75] Inventors: Yoshiya Hattori; Shinji Okuda, both of Kyoto; Masao Shizuki, Osaka, all of Japan

[73] Assignee: Sunstar Engineering Inc., Osaka, Japan

[21] Appl. No.: 499,397

[22] Filed: Jul. 7, 1995

[30] Foreign Application Priority Data

Jul. 7, 1994 [JP] Japan .................. 6-155623

[51] Int. Cl.$^6$ ............................. H01L 31/048
[52] U.S. Cl. ................ 136/251; 437/2; 437/209; 437/211; 437/215; 437/219; 257/433; 156/303.1; 156/331.4
[58] Field of Search .................. 136/251, 259; 257/433–434, 788; 437/2, 209, 211, 215, 219; 156/303.1, 331.4

[56] References Cited

U.S. PATENT DOCUMENTS

| | | | |
|---|---|---|---|
| 4,231,807 | 11/1980 | Keeling et al. | 136/251 |
| 4,249,958 | 2/1981 | Baudin et al. | 136/251 |
| 4,830,038 | 5/1989 | Anderson et al. | 136/251 |
| 5,476,553 | 12/1995 | Hanoka et al. | 136/251 |

FOREIGN PATENT DOCUMENTS

| | | | |
|---|---|---|---|
| 58-54679 | 3/1983 | Japan | 136/251 |
| 58-180070 | 10/1983 | Japan | 136/251 |
| 59-72778 | 4/1984 | Japan | 136/251 |
| 59-125671 | 7/1984 | Japan | 136/251 |
| 60-7761 | 1/1985 | Japan | 136/251 |
| 1-44071 | 2/1989 | Japan | 136/251 |
| 2-21670 | 1/1990 | Japan | 136/251 |
| 3-265177 | 11/1991 | Japan | 136/251 |
| 4-71276 | 3/1992 | Japan | 136/251 |
| 6-151935 | 5/1994 | Japan | 136/251 |

*Primary Examiner*—Aaron Weisstuch
*Attorney, Agent, or Firm*—Sughrue, Mion, Zinn, Macpeak & Seas

[57] ABSTRACT

A solar-cell module and a process for producing the same are disclosed. The solar-cell module comprising a solar-cell panel comprising a light-transmitting plate having a first surface and a second surface opposite to the first surface, and solar-cell elements disposed on the second surface; a frame disposed around the entire periphery of the solar-cell panel and having a flange on which the solar-cell panel is supported on the second surface while the first surface is free; and an adhesive layer disposed between the second surface of the solar-cell panel and the flange of the frame, wherein the adhesive layer comprises a reactive hot-melt adhesive comprising as a major component a urethane prepolymer obtained by reacting a polyhydroxy compound with an excess amount of a polyisocyanate compound. The solar-cell module can be produced easily and is excellent in quality and reliability.

8 Claims, 4 Drawing Sheets

SOLAR-CELL MODULE AND PROCESS FOR PRODUCING THE SAME

FIELD OF THE INVENTION

The present invention relates to a solar-cell module which can be produced easily and has excellent reliability, and also to a process for producing the same.

BACKGROUND OF THE INVENTION

Figure 4:
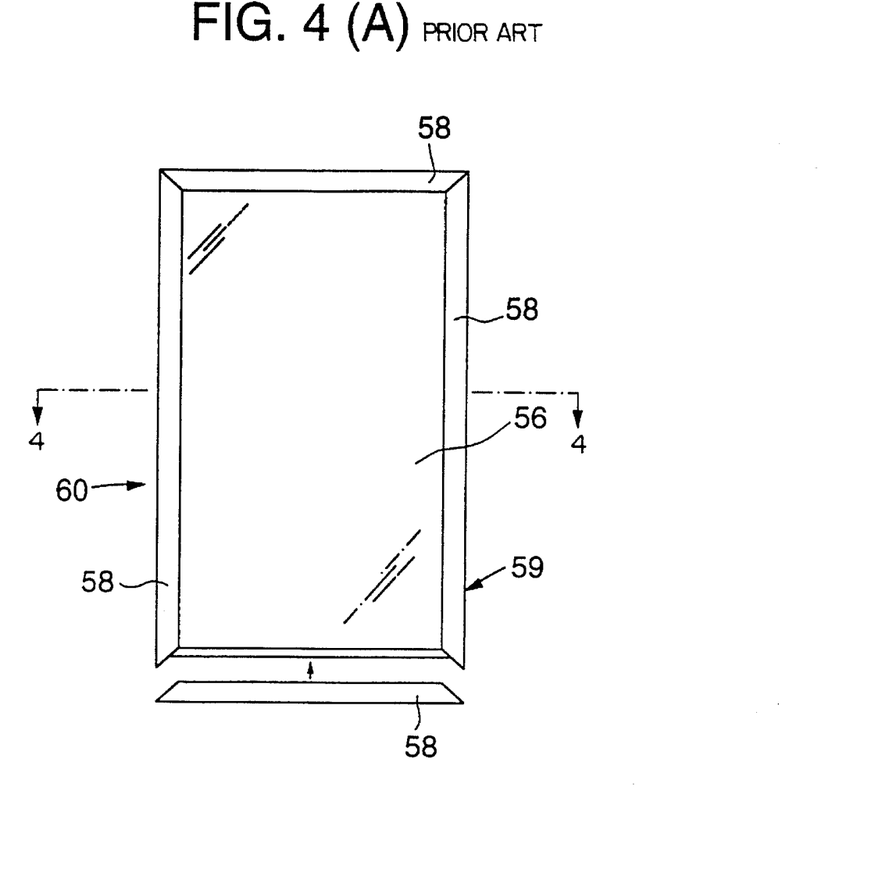
FIG. 4(A) is a plan view illustrating the structure of a conventional solar-cell module.
FIG. 4(B) is a sectional view taken on line 4—4 in FIG. 4(A).

With increasing concern about global environmental problems, interest in solar cells has been increasing in recent years. Solar cells are mostly installed outdoors in the form of a solar-cell module, which generally has a structure comprising a solar-cell panel and a frame into which the panel is fitted. FIGS. 4(A) and 4(B) shows the structure of such a conventional solar-cell module.

FIG. 4(A) is a plan view of a representative example of conventional solar-cell module structures and FIG. 4(B) is a sectional view taken on line B—B in FIG. 4(A). As shown in these figures, a conventional solar-cell panel 56 has generally employed a structure wherein solar-cell elements 53 disposed on a light-transmitting plate 50 on the side opposite to the sunlight-receiving surface are coated with a filler material 52, e.g., an ethylene/vinyl acetate copolymer (hereinafter referred to as "EVA"), and then covered with a back sheet 54 made of poly(vinyl fluoride) (hereinafter referred to as PVF). The solar-cell module 60 comprises a frame 59 composed of four aluminum frame members 58 which is fitted to the peripheries of the solar-cell panel 56. For fixing the solar-cell panel 56 to the frame 59, a sealant 62 such as butyl rubber, which is a tacky consistency material at ordinary temperature, is used to fit and fix the peripheries of the solar-cell panel 56. The solar-cell modules thus produced are fixed to an outdoor supporting structure with screws through installation holes 64 formed in the frame 59. Thus, a solar-cell array is constructed.

Use of a combination of a silicone sealant and a butyl rubber sealant in place of the butyl rubber used as the sealant has been proposed as described in unexamined published Japanese Utility Model Application No. Hei-4-130457.

However, the conventional solar-cell module 60 having the foregoing structure has the three major problems described below.

First, because of the manner in which the frame 59 is fitted to the solar-cell panel 56, the process for producing the solar-cell module 60 is complicated and this results in increased fluctuations in the external dimensions of the solar-cell module 60. As shown in the figure, in producing the conventional solar-cell module 60, the peripheries of the solar-cell panel 56 are fitted into U-shaped recesses of the four frame members 58 constituting the frame 59. Therefore, in the case where the solar-cell module 60 is rectangular, the four frame members 58 should be respectively fitted to the four peripheries of the solar-cell panel, as shown in FIG. 4(A), and be then fixed to one another with screws or by another means to construct the frame 59. That is, the first problem is that the fabrication procedure requires much time and labor. Moreover, the presence of the butyl rubber sealant 62 between the solar-cell panel 56 and the frame 59 has resulted in a drawback that the external dimensions of the solar-cell module 60 fluctuate as the thickness of this sealant layer 62 varies. Such fluctuations in the external dimensions of the solar-cell module 60 cause troubles in the fabrication of a solar-cell module array because of the shifting of the relative positions of the installation holes 64 and the outdoor supporting structure.

The second problem concerns the tacky consistency of the butyl rubber sealant at room temperature. If the solar-cell module 60 is exported to tropical areas, the packaged solar-cell module 60 heats up during use and, as a result, the butyl rubber sealant deforms or softens.

The use of butyl rubber in combination with, e.g., a moisture-curing silicone sealant at ordinary temperature is effective in eliminating the second problem described above. However, there is the third problem in that since the sealant is pasty at ordinary temperature and cures upon reaction with moisture, it remains in an uncured pasty state immediately after the fabrication of the solar-cell module 60, whereby the relative positions of the solar-Cell panel 56 and the frame 59 may shift due to slight vibrations caused by transport, stacking, and so on. Because of this, the solar-cell module 60 should be aged for from several hours to several days until the sealant cures, resulting in a low production efficiency.

As described above, the structure of the frame 59, the use of a butyl rubber sealant, and the use of a butyl rubber sealant and a silicone sealant in combination have caused serious problems concerning not only the quality of the conventional solar-cell module 60 but also the process for producing the module.

SUMMARY OF THE INVENTION

The present invention provides a solar-cell module which can be produced easily and is excellent in quality and reliability. The present invention further provides a process for producing the solar-cell module.

The solar-cell module of the present invention comprises:
- a solar-cell panel comprising a light-transmitting plate having a first surface and a second surface opposite to the first surface, and solar-cell elements disposed on the second surface,
- a frame disposed on the entire periphery of the solar-cell panel and having a flange on which the solar-cell panel is supported on the second surface while the first surface is free, and
- an adhesive layer disposed between the solar-cell panel and the flange of the frame,
- wherein the adhesive layer comprises a reactive hot-melt adhesive comprising as a major component a urethane prepolymer obtained by reacting a polyhydroxy compound with an excess of a polyisocyanate compound.

Another feature of the solar-cell module resides in that the reactive hot-melt adhesive further comprises a thermoplastic polymer.

The process for producing the above-described solar-cell module comprises the steps of:
- providing a solar-cell panel comprising a light-transmitting plate having a first surface and a second surface opposite to the first surface, and solar-cell elements disposed on the second surface, and a frame capable of being disposed to the entire periphery of the solar-cell panel and having a flange for supporting thereon the solar-cell panel,
- applying onto the flange of the frame a reactive hot-melt adhesive comprising as a major component a urethane prepolymer obtained by reacting a polyhydroxy compound with an excess of a polyisocyanate compound to form an adhesive layer, and placing the solar-cell panel onto the adhesive layer on the flange in a manner such that the second surface contacts the adhesive layer thereby bonding the solar-cell panel with the frame via the adhesive layer.

In the step of providing the solar-cell panel and the frame a frame production step may be involved for producing a frame capable of being disposed around the entire periphery of the solar-cell panel and having a flange for supporting thereon the solar-cell panel with the solar-cell elements. This frame may be produced by assembling frame members respectively corresponding to the peripheries of the solar-cell panel, or may be integrally formed by die casting, injection molding, cutting, and the like.

DETAILED DESCRIPTION OF THE INVENTION

The reactive hot-melt adhesive for use in this invention comprises as a major component a urethane prepolymer obtained by reacting a polyhydroxy compound with an excess of a polyisocyanate compound. The reactive hot-melt adhesive is solid or semisolid at ordinary temperature, turns into a flowable paste or a liquid upon heating, and solidifies upon cooling again to ordinary temperature to exhibit an initial bonding strength. After solidification, the adhesive cures further by reaction with water. As a result, the moisture-cured adhesive has exceedingly high durability with respect to heat resistance, water resistance, and the like.

Consequently, the solar-cell module of this invention produced with the use of the reactive hot-melt adhesive is characterized in that not only the problems encountered in use in tropical areas are eliminated, but also the procedure for producing the solar-cell module can be carried out easily and speedily.

The reactive hot-melt adhesive, which comprises as a major component a urethane prepolymer obtained by reacting a polyhydroxy compound with an excess of a polyisocyanate compound may further comprises a thermoplastic polymer according to need. In addition, an adhesion promoter, a plasticizer, a softener, a filler, a dye, a pigment, an antioxidant, a dehydrating agent, and other ingredients may further be added thereto if desired or necessary.

The urethane prepolymer is obtained by reacting:

one or more polyhydroxy compounds selected from polyoxyalkylene ether polyols, polyester polyols, acrylic polyols, rubber polyols such as polybutadiene polyols, castor oil derivatives, and the like with an excess of one or more polyisocyanate compounds selected from diphenylmethane diisocyanate, dimethyldiphenylmethane diisocyanate, naphthalene diisocyanate, isophorone diisocyanate, cyclohexylmethane diisocyanate, tolylene diisocyanate, tetramethylene diisocyanate, hexamethylene diisocyanate, xylene diisocyanate, p-phenylene diisocyanate, trimethylolpropane adducts of polyisocyanates, polymers of polyisocyanates, and the like for several hours with heating at 60° to 130° C. These reactants are suitably selected and used in a suitable proportion so as to obtain desired properties. The urethane prepolymer has active NCO groups. It is a liquid to solid at ordinary temperature and undergoes a curing reaction with moisture in the air.

Typical and preferred examples of the reactive hot-melt adhesive for use in this invention include the hot-melt adhesives disclosed in JP-A-5-5088. (The term "JP-A" as used herein means an "unexamined published Japanese patent application.") Specifically, the reactive hot-melt adhesive comprises a urethane prepolymer obtained by reacting a hydroxyl-terminated polyoxyalkylene ether polyol having a molecular weight of from 6,000 to 40,000 with an excess of a polyisocyanate compound, and further comprises a thermoplastic polymer. In this instance, it is preferred that the urethane prepolymer is one obtained by reacting the polyisocyanate compound with the polyoxyalkylene ether polyol in an amount to give a NCO/OH equivalent ratio of from 1.5 to 3.5 and the content of the prepolymer is from 20 to 60% by weight.

With respect to the thermoplastic polymer, it is preferred that the content thereof is from 5 to 50% by weight.

Examples of the polyoxyalkylene ether polyol to be used in this invention include polyoxyalkylene ether polyols represented by the formula:

wherein n is an integer of 13 to 350; m is an integer of 0 to 440; R is a hydrocarbon residue having 2 to 6 carbon atoms, especially an alkylene group; and a is an integer of 2 to 8, preferably 2 to 4, e.g., polyoxypropylene diol, polyoxypropylene-ethylene diol, polyoxypropylene triol, polyoxypropylene tetrol, and polyoxypropylene-ethylene tetrol, which may be obtained by the ring-opening polymerization of propylene oxide or a mixture of propylene oxide and ethylene oxide in the presence of one or more polyhydroxy compounds represented by the formula:

$$R\text{-OH})_a$$

wherein R and a have the same meanings as defined above, e.g., ethylene glycol, diethylene glycol, propylene glycol, butylene glycol, or 1,6-hexanediol when a=2; glycerol, trimethylolpropane, triethylenetriol, or 1,2,6-hexanetriol when a=3; pentaerythritol when a=4; sorbitol when a=6; and sucrose when a=8, and an appropriate catalyst (e.g., a metal catalyst). Of these polyoxyalkylene ether polyols, those having a molecular weight of from 6,000 to 40,000 are preferably used, with those having a molecular weight of from 10,000 to 30,000 being more preferred from the standpoints of the physical properties of the reactive hot-melt adhesive and the consistency and workability of the urethane prepolymer.

Also usable are polyoxyalkylene ether polyols obtained by the ring-opening polymerization of butylene oxide in place of propylene oxide (PO) or ethylene oxide (EO) in the same manner as the above.

If the molecular weights of the polyoxyalkylene ether polyols are lower than 6,000, insufficient elongation and too high hardness result at low temperatures (−30° to −40° C.). On the other hand, if the molecular weights thereof exceed 40,000, this causes no problem concerning physical properties, but may cause difficulty in the synthesis at present because of too large an amount of by-products. In these polyoxyalkylene ether polyols, the number of functional groups (the number of OH groups, i.e., "a") is preferably from 2 to 4, especially from 2 to 3.

Since these polyoxyalkylene ether polyols generally have an exceedingly low glass transition temperature ($T_g$) ranging from −70° to −60° C., the moisture-cured sealant exhibits elastomeric properties at low temperatures.

The polyisocyanate compound to be used in this invention may be one for use in producing conventional urethane resins, such as those enumerated above. Specific examples thereof include 2,4- or 2,6-tolylene diisocyanate, 4,4'-diphenylmethane diisocyanate (MDI), 1,3- or 1,4-xylylene diisocyanate, 1,5-naphthalene diisocyanate, isophorone diisocyanate, hexamethylene diisocyanate, tetramethylene diisocyanate, trimethylolpropane adducts of these polyisocyanates, and polymers of polyisocyanates. Among them, MDI is particularly preferred from the standpoints of moisture-curing rate, safety, and industrial cost.

The urethane prepolymer for use in this invention is obtained by reacting the polyoxyalkylene ether polyol with an excess of a polyisocyanate compound usually under conditions of a temperature of from 60° to 130° C. and a reaction time of from 0.5 to 5 hours. These reactants may be used in such a proportion that the NCO/OH equivalent ratio is from 1.5 to 3.5, preferably from 2 to 3. If this ratio is lower than 1.5, the urethane prepolymer obtained may increase in viscosity abruptly and have exceedingly poor storage stability at high temperatures of from 70° to 80° C. If that ratio exceeds. 3.5, NCO groups remain in excess and, as a result, foaming is caused by $CO_2$ during moisture-curing, although the storage stability at high temperatures of 70° to 80° C. is improved.

Examples of the thermoplastic polymer for use in this invention include, basically, polymers obtained by reacting a polyfunctional compound containing a ring and active hydrogen (generally having a molecular weight of from 400 to 2,000) and a diol or triol ingredient (e.g., a diol such as ethylene glycol, 1,4-butanediol, 1,6-hexanediol, 1,8-octanediol, a polycarbonate diol, polytetramethylene glycol, hydrogenated polybutadiene diol, a polyacrylic diol, a polyoxyalkylene ether diol, a polyoxyalkylene adduct of a bisphenol, and another compound having active hydrogen; and a triol such as trimethylolpropane, glycerol, triethylenetriol, and a polyoxyalkylene ether triol) with an excess of a polyisocyanate compound (the aforementioned polyisocyanates are usable, but MDI is preferred from the standpoints of enhancing the cohesive energy of the polyurethane and, in particular, of safety and industrial cost).

Examples of the polyfunctional compound containing a ring and active hydrogen include bisphenol resins, terpene resins, coumarone resins, xylene resins, rosin ester resins, styrene resins, phenolic resins, terpene-phenol resins, rosin resins, and polyester resins. An example of the thus-produced thermoplastic polymers (generally having a melting point of from 70° to 100° C.) is commercially available from, for example, Toyo Kagaku Kenkyusho Co., Ltd., Japan under the trade name of "Thermoplastic Resin Toyo Ace U-B."

This thermoplastic polymer contributes to an improvement in the development of the initial bonding strength of the reactive hot-melt adhesive. Due to the incorporation of urethane bonds and a ring compound into the molecule through the above-described reaction, this polymer is capable of emitting molar cohesive energy to become thermoplastic. In addition, this polymer shows good compatibility with the urethane prepolymer due to the polarity attributable to the ring compound and urethane bonds.

Other usable thermoplastic polymers include polyurethane resins, polyester resins, polyolefin resins, styrene resins, poly(vinyl chloride) resins, polyamide resins, and rubbers.

The thermoplastic polymer is effective not only in reducing the glass transition temperature of the reactive hot-melt adhesive to impart low-temperature elasticity, but also in reducing changes in physical properties over a range of from low to high temperatures. The thermoplastic polymer also improves the cohesive force of the adhesive and enhances the initial bonding strength thereof. In addition, the thermoplastic polymer is also capable of contributing to, e.g., a cost reduction for the reactive hot-melt adhesive. An ethylene-vinyl acetate copolymer can be especially preferably used.

The reactive hot-melt adhesive for use in the present invention is characterized as containing the urethane prepolymer described above and, preferably, further containing the thermoplastic polymer. Other components and the contents thereof may be suitably selected. A preferred example of a basic composition of the reactive hot-melt adhesive comprises 20–60% (% by weight; the same applies hereinafter) (preferably 30–50%) of urethane prepolymer, 50% or less of the thermoplastic polymer, 50% or less of a filler, 20% or less of a plasticizer, and 10% or less of the additives as mentioned above.

If the content of the urethane prepolymer is lower than 20%, the moisture-cured adhesive tends to be insufficient in elongation under low-temperature, which is a basic physical property, and also have too high hardness. If the content thereof exceeds 60%, the adhesive tends to have impaired workability.

If the content of the thermoplastic polymer exceeds 50%, the moisture-cured adhesive tends to have unsatisfactory physical properties under low temperature.

Examples of the filler include silicic acid derivatives, talc, metal powders, calcium carbonate, clay, and carbon black. If the content of this filler exceeds 50%, the reactive hot-melt adhesive has a too high viscosity when melted by heating, and this high viscosity tends to adversely influence the adherence and physical properties of the adhesive.

Examples of the plasticizer include dibutyl phthalate, dioctyl phthalate, dicyclohexyl phthalate, diisooctyl phthalate, diisodecyl phthalate, dibenzyl phthalate, butyl benzyl phthalate, trioctyl phosphate, epoxy plasticizers, toluenesulfonamide, chloroparaffins, adipic esters, and castor oil. If the content thereof exceeds 20%, adhesiveness and initial bonding strength tend to be impaired.

More specific examples of the additives include solvents for viscosity regulation, curing catalysts, thixotropic agents (e.g., bentone, silicic anhydride, silicic acid derivatives, and urea derivatives), dyes and pigments, ultraviolet absorbers, tackifiers, flame retardants, silane compounds, adhesion promotors and dehydrating agents. If the content of these additives exceeds 10%, the adhesive tends to be impaired in consistency and physical properties.

The reactive hot-melt adhesive for use in this invention may be prepared, for example, by the following procedure. First, a thermoplastic polymer, when used, is introduced into a vessel heated at around the melting temperature and capable of nitrogen replacement. A urethane prepolymer is then added thereto in a nitrogen atmosphere. After the contents are stirred, a filler is added and, if necessary, a plasticizer is further added thereto and the resulting contents are then stirred with degassing under vacuum. Thereafter, additives such as a solvent for viscosity regulation and a curing catalyst are added, and this mixture is stirred with degassing under vacuum to prepare the reactive hot-melt adhesive for use in the present invention. It should be noted that the procedure of ingredient introduction is not limited to the above example. For example, a urethane prepolymer may be synthesized in a reaction vessel into which a plasticizer has been introduced in advance. Further, a thermoplastic polymer and additives may be added after the synthesis of a urethane prepolymer. In using the reactive hot-melt adhesive, those surfaces of a solar-cell panel and a flange of a frame which are to be bonded therewith may be coated with a primer in advance if desired or necessary, and then the adhesive is heated to the melting point thereof or above and applied. A robot (manipulator) may be employed to automatically apply the adhesive, a hot-melt applicator may be used therefor.

The primer for use in producing the solar-cell module of the present invention may be prepared by dissolving, as a main component, one or more of a polyisocyanate compound, a silane coupling agent, and a titanate coupling agent into an organic solvent and, if necessary, adding thereto a film-forming substance such as an acrylic resin, a polyester resin, and a chlorinated polymer. The vehicle of the primer is usually a 3-20% by weight solvent solution. In practicing the process of the present invention, the primer may be applied by brushing, spraying, and the like and dried for several minutes or more, and then the reactive hot-melt adhesive is applied to the primed surface to give an adhesive layer, followed by bonding the solar-cell panel with the frame via the adhesive layer.

The constitution of the present invention described above has the following functions.

First, the frame has a shape that is capable of being disposed around the entire periphery of the solar-cell panel and has a flange on which the solar-cell panel is supported on a second surface (i.e., the surface opposite to a first surface (i.e., the sunlight-receiving surface)) while the first surface is free. According to this construction, the flange forms a shelf-like structure extending toward the inside of the frame, whereby it is possible to place the solar-cell panel on the flange to bond thereto even after the frame has been produced in a shape corresponding to the contour of the solar-cell panel.

The solar-cell panel used herein may be the same as the conventional one comprising a light-transmitting plate and solar-cell elements disposed thereon on the side opposite to the sunlight-receiving surface.

Furthermore, since the reactive hot-melt adhesive used for bonding the solar-cell panel to the frame, which adhesive comprises as a major component a urethane prepolymer obtained by reacting a polyhydroxy compound with an excess of a polyisocyanate compound, is hot-melt type and moisture-curing reactive with moisture in the air, it undergoes an abrupt increase in viscosity to lose flowability upon cooling after application with heating and then solidifies to develop initial bonding strength within several seconds to several minutes, depending on the amount of the adhesive applied. In addition, since the adhesive is capable of curing by reacting with moisture, it comes to have rubber elasticity with a higher hardness as a result of subsequent curing reaction.

In the process for producing the above-described solar-cell module, there are provided first a solar-cell panel comprising a light-transmitting plate and solar-cell element disposed on a second surface (a surface opposite to a sunlight-receiving surface (a first surface)) of the plate, and a frame capable of being disposed on the entire periphery of the solar-cell panel and having a flange on which the solar-cell panel is supported on the second surface while the first surface is free.

Next, an adhesive application step is carried out, in which a reactive hot-melt adhesive comprising as a major component a urethane prepolymer obtained by reacting a polyhydroxy compound with an excess of a polyisocyanate compound is applied onto the flange of the frame to form an adhesive layer. This adhesive may be applied either sporadically on the flange surface or over the entire bonding surface of the flange. It is preferable to apply a primer onto the respective surface prior to the application of the reactive hot-melt adhesive.

In the subsequent solar-cell panel bonding step, the solar-cell panel is placed on the flange of the frame to bond the solar-cell panel with the frame via the adhesive layer formed in the adhesive application step, thereby completing a solar-cell module.

The reactive hot-melt adhesive used in the adhesive layer for bonding the solar-cell panel to the frame, which adhesive comprises as a major component a prepolymer obtained by reacting a polyhydroxy compound with an excess of a polyisocyanate compound, can be speedily cured by reacting with moisture in the air. Although the adhesive has not been completely cured at this stage, it already has a strength sufficient to prevent the frame from shifting from its correct position even when the solar-cell module obtained is transported, stacked, and packed. The adhesive cures by reacting with moisture in the air and, as a result, the adhesive comes to have sufficient bonding strength and rubber elasticity in several days.

DESCRIPTION OF PREFERRED EMBODIMENTS

The present invention is explained below with reference to embodiments thereof. FIG. 1(A) is a plan view of the structure of a solar-cell module according to the present invention; and FIG. 1(B) is a sectional view taken on line 1—1 in FIG. 1(A). These figures show the structure of a solar-cell module 11, as an embodiment, which comprises a solar-cell panel 5 comprising a light-transmitting plate 1 and solar-cell elements 3 disposed thereon on a second surface (i.e., the side opposite to a first surface (the sunlight-receiving surface)) and a frame 9 disposed on the entire periphery of the solar-cell panel 5 and having a flange 7 on which the solar-cell panel 5 is supported on the second surface while the first surface of the solar-cell panel 5 is free. In this embodiment, the frame 9 is an integrally formed structure produced by the die casting of aluminum, injection molding of an engineering plastic, and the like.

The solar-cell panel 5 in the present invention is placed on the flange 7 of the frame 9 in a manner such that its first surface (sunlight-receiving side) is free. The solar-cell panel 5 is fixed to the frame 9 via an adhesive layer 13 comprising a reactive hot-melt adhesive which provides sufficient bonding strength, in place of a conventional sealant comprising a butyl rubber sealant or a combination of a butyl rubber sealant and a silicone sealant. This adhesive layer 13 preferably comprises the reactive hot-melt adhesive comprising as a major component a urethane prepolymer obtained by reacting a polyhydroxy compound with an excess of a polyisocyanate compound; one preferred and detailed embodiment of this adhesive will be given later.

Figure 1:
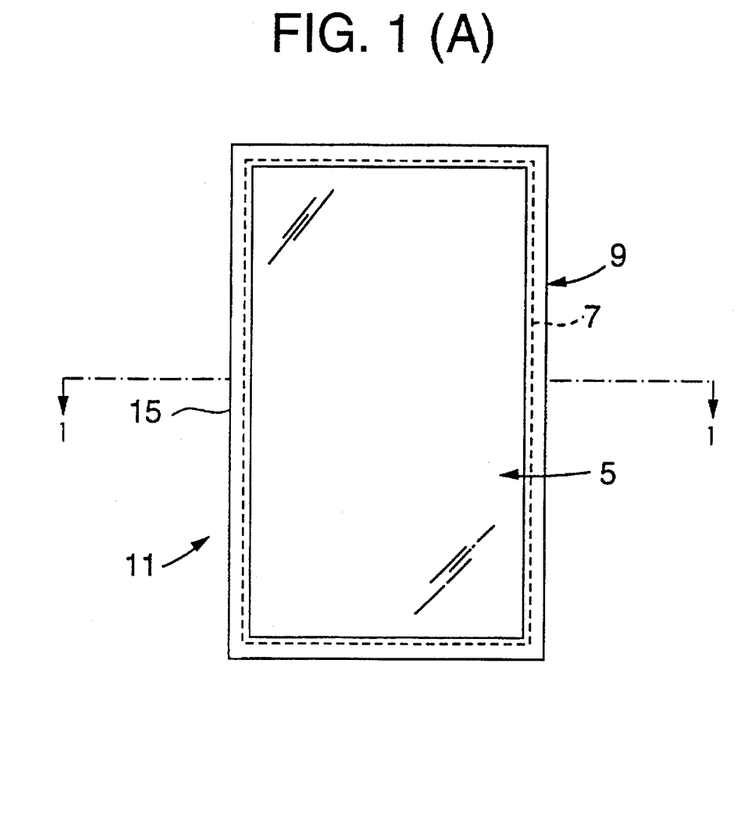
FIG. 1(A) is a plan view illustrating the structure of a solar-cell module according to the present invention.
FIG. 1(B) is a sectional view taken on line 1—1 in FIG. 1(A).
Figure 2:
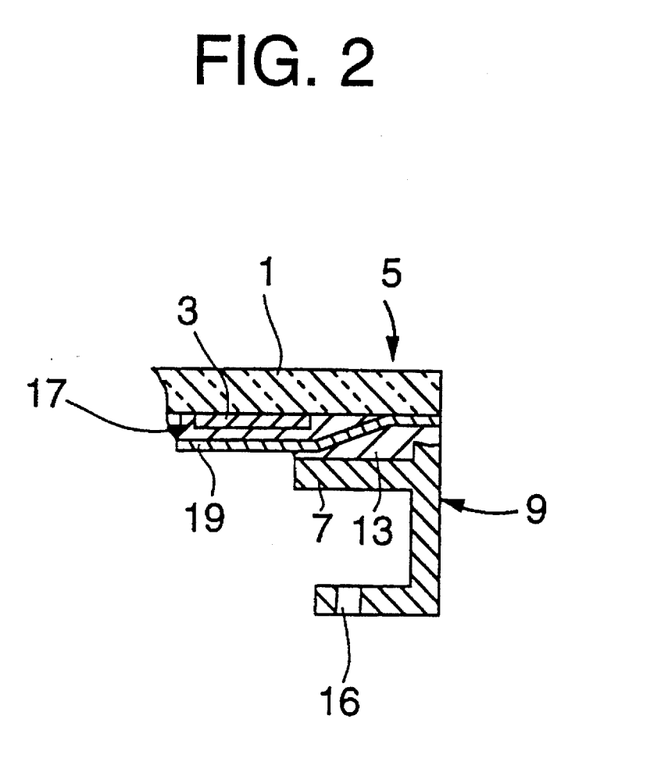
FIG. 2 is a sectional view illustrating an example of the structure of a part in which a solar-cell panel is disposed onto the frame in a solar-cell module according to the present invention.

For improving waterproofing function, it is effective to cover the exposed areas of the adhesive layer 13 on the side opposite to the flange with a molding member 15 as shown in the figure according to need. Besides the embodiment shown in FIGS. 1(A) and 1(B), an embodiment which does not employ the molding member 15 in the bonding areas is shown in FIG. 2. The molding member 15 is disposed prior to the solidification of the reactive hot-melt adhesive in the adhesive layer 13. As the adhesive in the adhesive layer 13 solidifies and cures, the solar-cell panel 5, the frame 9, and the molding member 15 are bonded and fixed to one another. Each of the solar-cell modules respectively shown in FIGS. 1 and 2 is fixed through installation holes 16 to a supporting structure for array installation.

In the embodiments shown in the figures, the solar-cell panel 5 employs a flat glass as the light-transmitting plate 1, and crystalline solar-cell elements 3 disposed thereon on the side opposite to sunlight-receiving surface are sealed with an EVA filler material 17. Then, the EVA filling material 17 on the solar-cell panel 5 is covered with a back sheet 19 comprising an aluminum foil sandwiched between PVF films. The solar-cell elements 3 are interconnected through wires disposed in the filler material 17 and are connected to output terminals in terminal boxes disposed on the back sheet 19 to enable the generated electricity to be taken out, though this electrical connection system is not shown in the figures.

In the above-described embodiments, the solar-cell panels employ crystalline solar cells as the solar-cell elements 3. However, solar-cell panels of other types may also be used. For example, another usable solar-cell panel is fabricated by forming solar-cell elements 3 made of a thin-film semiconductor, e.g., amorphous silicon, directly on a transparent plate 1 on the side opposite to the sunlight-receiving surface and coating the solar-cell elements with a protective layer made of, e.g., an epoxy resin. Thus, the structure of the solar-cell panel 5 in the present invention is not particularly limited.

The following reference examples illustrate the reactive hot-melt adhesive to be used in producing the adhesive layer 13 in the solar-cell module 11 described above, which were prepared under the following conditions.

REFERENCE EXAMPLE 1

(1) Synthesis of Urethane Prepolymer:
Into a reaction vessel the inside atmosphere of which has been replaced with nitrogen is introduced 2,000 g of a polyoxypropylene-ethylene triol having a molecular weight of 12,500 (X-8805, manufactured by Asahi Glass Co., Ltd., Japan; trifunctional; EO content: 12%; OH value: 13.8). The contents are dried under vacuum (10 mmHg or lower). After the water content is ascertained to have decreased to or below 0.05%, 158 g of 4,4'-diphenylmethane diisocyanate (MDI) is added to the reaction vessel (NCO/OH=2.61), and the reactants are allowed to react for 1 hour at a regulated temperature of 80°±5° C. Thereafter, 1 g of a 1% xylene solution of dibutyltin dilaurate (DBTDL) is added thereto, and the reactants are allowed to react at that temperature for 2 hours to obtain a urethane prepolymer having a free NCO content of 1.48% and viscosities of 24,000 cps at 80° C. and 380,000 cps at 20° C.

(2) Preparation of Reactive Hot-Melt Adhesive:
Into a reaction vessel the inside atmosphere of which has been replaced with nitrogen is introduced 400 g of the urethane prepolymer obtained in step (1) above. The temperature of the content is regulated to 80°±10° C. A melt of 100 g of a thermoplastic polymer (Thermoplastic Resin Toyo Ace U-B, manufactured by Toyo Kagaku Kenkyusho Co., Ltd.) is then added at 90° C. over a period of 3 hours, and the mixture is stirred at this temperature for 20 to 30 minutes to dissolve the polymer. Thereafter, 50 g of dicyclohexyl phthalate is added, followed by 350 g of a dried carbon black and 100 g of a dried calcium carbonate. After the resulting mixture is stirred for 30 minutes under a vacuum of 10 mmHg, 50 g of xylene for viscosity regulation and a curing catalyst (0.3 g of a 1% xylene solution of DBTDL) are added. This mixture is stirred with degassing under vacuum for 30 minutes and then packed into an aluminum cartridge.

REFERENCE EXAMPLE 2

(1) Synthesis of Urethane Prepolymer:
100 Parts (parts by weight; the same applies hereinafter) of a thermoplastic saturated polyester polyol having a molecular weight of 20,000 (terephthalic acid-based; glass transition temperature: 3° C.) is heated to 160° C. with a heating kneader. Thereto is added 30 parts of a liquid polyester polyol having a molecular weight of 2,000 (New Ace F7-67, manufactured by Asahi Denka Kogyo K. K., Japan), followed by 50 parts of an adipic ester plasticizer. This mixture is stirred with degassing at 140° C. for 1 hour and then cooled to 120° C. Thereto is added 10 parts of 4,4'-diphenylmethane diisocyanate (MDI). The reactants are allowed to react at 120° C. with stirring and degassing until the isocyanate group content becomes constant (about 1.1%). Thus, a urethane prepolymer solution is obtained.

(2) Preparation of Reactive Hot-Melt Adhesive:
To 599 parts of the urethane prepolymer solution described above is added 400 parts of carbon black dried in advance at 200° C. as a filler. This mixture is stirred with heating for 30 minutes and then stirred with heating and degassing for 30 minutes. Thereto is added 1 part of a 5% dioctyl phthalate solution of DBTDL as a curing catalyst. The resulting mixture is stirred with heating and degassing to obtain a reactive hot-melt adhesive.

REFERENCE EXAMPLE 3

(1) Synthesis of Urethane Prepolymer:
100 Parts of 1,4-butanediol is stirred with degassing at 80°±10° C. for 2 hours. Thereto is added 389 parts of 4,4'-diphenylmethane diisocyanate (MDI) (NCO/OH=1.4). The reactants are allowed to react at 80°±5° C. for 4 hours to obtain a diisocyanate oligomer having an active NCO group content of 7.6%. Subsequently, 100 parts of a polyether triol having a molecular weight of 5,000 (PPG MN-5000, manufactured by Mitsui Toatsu Chemicals, Inc., Japan) is stirred with degassing at 80°±10° C. for 2 hours, and 72.9 parts of the above-described diisocyanate oligomer having an active NCO group content of 7.6 % is added thereto (NCO/OH=2.2). The reactants are allowed to react at 80°±5° C. for 3 hours to obtain a urethane prepolymer solution having an active NCO group content of 1.7%.

(2) Preparation of Reactive Hot-Melt Adhesive:

To 43 parts of the urethane prepolymer solution described above are added 42 parts of carbon black dried in advance at 200° C. as a filler and 10 parts of butyl benzyl phthalate as a plasticizer. After this mixture is stirred with degassing at 80° C. for 1 hour, 0.5 parts of a 10% dioctyl phthalate solution of dibutyltin dilaurate (DBTDL) as a curing catalyst is added thereto to obtain a reactive hot-melt adhesive.

COMPARISON 1

As a comparison for the above-described reactive hot-melt adhesives for use in the present invention, a butyl rubber-sealant based hot-melt adhesive having the following composition is prepared. This adhesive is referred to as "Comparison 1."

The composition consists of 20% by weight Butyl Rubber 065 manufactured by Exxon Chemical Co., 20% by weight APP B-3000 manufactured by Mitsubishi Petrochemical Co., Ltd., Japan, 24% by weight Polybutene HV-300 manufactured by Nippon Oil Co., Ltd., Japan, 32% by weight Tackifier Arkon P-115 manufactured by Arakawa Chemical Industries, Ltd., Japan, and 4% by weight PP Wax HWNP055 manufactured by Mitsubishi Petrochemical Co., Ltd.

COMPARISON 2

A commercially available one-pack-type silicone sealant (Penguin Seal #2505, manufactured by Sunstar Engineering Inc., Japan) is referred to as "Comparison 2".

BONDING TEST

Adhesives of Reference Examples 1 to 3 and the two Comparisons were subjected to a bonding strength test. The results obtained are shown in Table 1. The test items, conditions, and methods are shown in Table 2. The primers used in the Examples and Comparative Example 2 are specified in the notes below Table 1.

TABLE 1

| | (Test results for adhesives) | | | | |
| --- | --- | --- | --- | --- | --- |
| | Reference Example | | | Comparison | |
| Test Item | 1 | 2 | 3 | 1 | 2 |
| Initial bonding strength ($kgf/cm^2$) | 0.3 | 0.3 | 0.2 | 1.0 | ≦0.1 unable to be measured |
| Shear bonding strength ($kgf/cm^2$) | 40.0 | 45.0 | 41.0 | 1.0 | 21.0 |
| High-temperature creep resistance | no change | no change | no change | fell | no change |

(Notes)
Primers used:
For Reference Examples 1–3: Primer 435-40 (manufactured by Sunstar Engineering Inc.)
For Comparison 2:
Primer SD (manufactured by Sunstar Engineering Inc.)

TABLE 2

| (Conditions and methods for the test shown in Table 1) | |
| --- | --- |
| Test Item | Conditions and Methods |
| Initial bonding strength ($kgf/cm^2$) | Shear strength measured after 10-min. standing at 20° C., 65% RH. Adhesive part dimensions: 3 mm (t) by 12.5 mm by 25 mm; rate of pulling: 50 mm/min. |
| Shear bonding strength ($kgf/cm^2$) | Shear strength measured after 7-day standing at 20° C., 65% RH. Adhesive part dimensions: 3 mm (t) by 12.5 mm by 25 mm; rate of pulling: 50 mm/min. |
| High-temperature creep resistance | A test piece having adhesive part dimensions of 3 mm (t) by 12.5 mm by 25 mm is allowed to stand at 20° C., 65% RH for 7 days. A weight of 500 g is hung on one end of the test piece, and this test piece is held vertical at 90° C. for 48 hours to examine as to whether the test piece falls. |

As shown in the tables, since the reactive hot-melt adhesives used in the present invention (Adhesives of Reference Examples 1–3) are of the hot-melt type, they were superior in the initial bonding strength to the conventional adhesive (sealant). Further, the reactive hot-melt adhesives were also superior in bonding strength and high-temperature creep resistance after complete cure to the butyl rubber-sealant based hot-melt adhesive as shown in the tables.

One preferred embodiment of the process for producing a solar-cell module 11 according to the present invention is then explained in detail by reference to a drawing.

Figure 3:
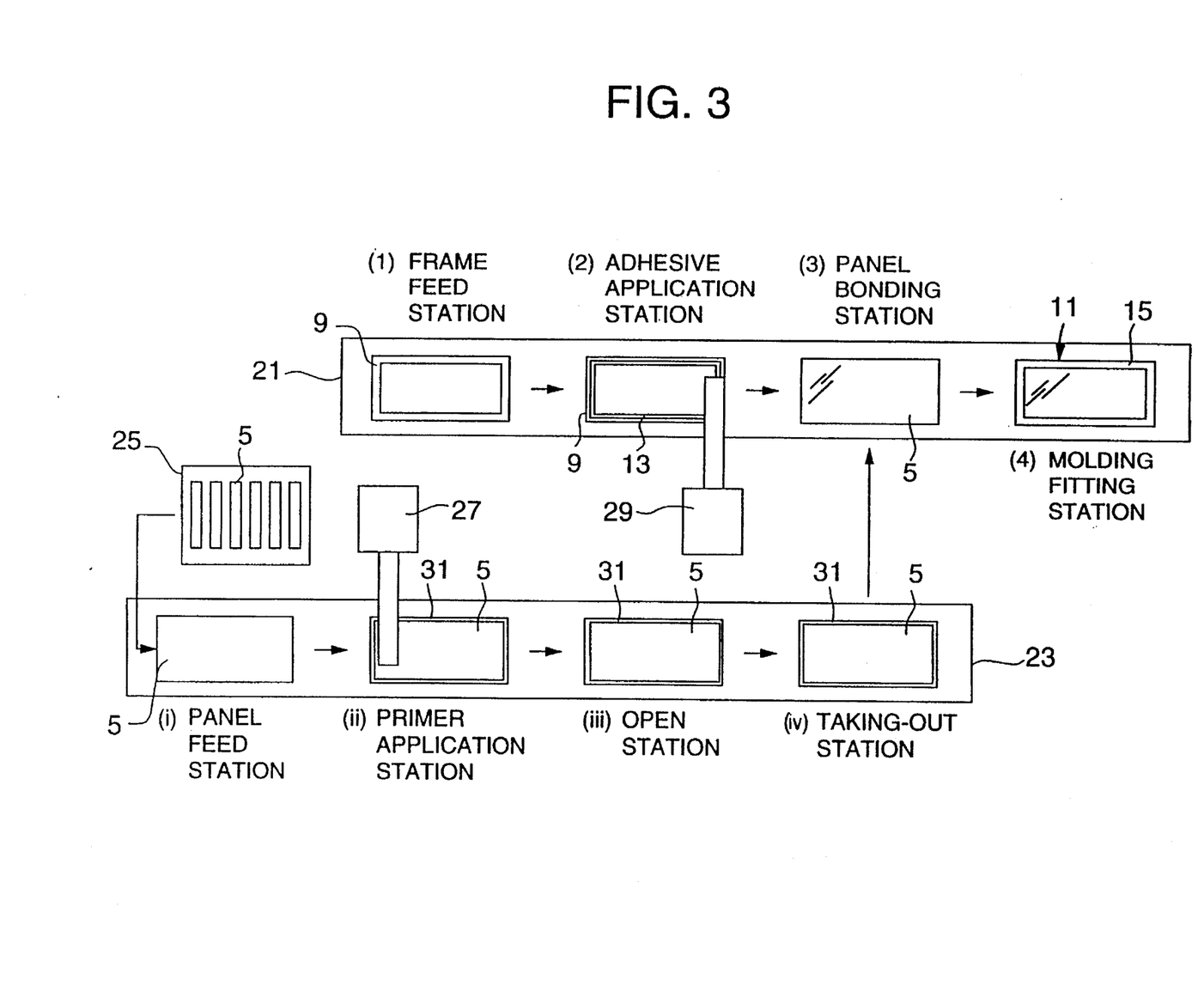
FIG. 3 illustrates an example of steps for fabricating a solar-cell module according to the present invention.

FIG. 3 schematically illustrates a process for fabricating the solar-cell module 11 of the present invention. The process shown in the figure comprises two separate lines for solar-cell module fabrication, i.e., a frame line 21 and a solar-cell panel line 23. The lines shown in the figure are explained below using as an embodiment a process for producing a crystalline solar-cell module.

First, a solar-cell panel 5 is taken out of a panel pallet 25 and fed to a panel feed station (i) on the solar-cell panel line 23. This solar-cell panel 5 employs a flat glass as a light-transmitting plate 1, and crystalline solar-cell elements 3 disposed thereon on the side opposite to the sunlight-receiving surface are sealed with an EVA filling material 17, with the EVA filling material 17 on the solar-cell panel 5 being covered with a back sheet 19 comprising an aluminum foil sandwiched between PVF films.

In a primer application station (ii), a primer 31 is subsequently applied to the surface of a part of the solar-cell panel to be bonded to a frame 9. This primer 31 is used as an adhesive promoter for promoting the adhesion of a reactive hot-melt adhesive in an adhesive layer 13, and an example thereof includes Primer #435–40, manufactured by Sunstar Engineering Inc.

The primer 31 is then allowed to dry for about 1 minute in an open station (iii), and the primed solar-cell panel is sent from a taking-out station (iv) toward the frame line.

In the frame line 21, on the other hand, a fabricated frame 9 is fed to a frame feed station (1). This frame 9 has the structure shown in FIGS. 1 or 2. Namely, the frame 9 has a flange 7 for supporting thereon the solar-cell panel 5 with the solar-cell elements 3 on the side opposite to the sunlight-receiving surface, and has a shape that is capable of being disposed around the entire periphery of the solar-cell panel 5 while allowing the side of the sunlight-receiving surface of the solar-cell panel 5 to be free. It is possible to produce the frame 9 in a frame production step before the frame feed station. The frame 9 may have an integral structure produced by casting or injection molding, or may be produced by assembling four frame members.

Subsequently, in an adhesive application station (2) for applying a reactive hot-melt adhesive, a reactive hot-melt adhesive for an adhesive layer 13, which comprises as a major component a urethane prepolymer obtained by reacting a polyhydroxy compound with an excess of a polyisocyanate compound, is melted by heating to 70° C. and applied to the bonding surface of the frame 9, i.e., mainly on the flange 7 (adhesive application step). If desired and necessary, a step for applying a primer to the frame 9 mainly on the flange 7 may be performed in the same manner as the foregoing manner prior to the adhesive is applied to the frame 9.

In a panel bonding station (3), the primed solar-cell panel 5 sent from the taking-out station (iv) of the solar-cell panel line 23 is then placed on the flange 7 of the frame 9 to which the reactive hot-melt adhesive for the adhesive layer 13 has been applied (solar-cell panel bonding step). Finally, in a molding fitting station (4), a molding member 15 is fitted, if desired and necessary, to the exposed parts of the reactive hot-melt adhesive layer 13 on the side opposite to the flange as shown in FIG. 1 to complete a solar-cell module 11. This fitting of the molding member 15 may be accomplished by disposing the molding member 15 before the reactive hot-melt adhesive in the adhesive layer 13 cools and solidifies. At this stage, the reactive hot-melt adhesive in the adhesive layer 13 has not cured completely and, hence, does not have the full bonding strength shown in Table 1. However, since the adhesive is of the hot-melt type, it already has sufficient initial bonding strength as a result of cooling and solidification after the solar-cell panel 5 has been placed on the flange 7 of the frame 9 (and the molding member 15 has optionally been fitted). Therefore, the adhesive causes no particular troubles in the subsequent inspection step, etc.

The transport of the solar-cell panel 5 and the frame 9 to or from the frame line 21 and the solar-cell line 23 and the application of the primer 31 and the reactive hot-melt adhesive for the adhesive layer 13 in these lines are preferably conducted by appropriate application manipulators 27 and 29. Each of these manipulators may be a generally employed six-arm articulated robot.

The present invention described above produces the following excellent effects because of its functions explained hereinabove.

First, the frame has a shape that is capable of being disposed around the entire periphery of the solar-cell panel and has a flange on which the solar-cell panel is supported on the second surface (i.e., the surface opposite to the first surface) while the first surface (i.e., the sunlight-receiving surface) is free. According to this construction, the flange forms a shelf-like structure extending toward the inside of the frame, whereby it is possible to place the solar-cell panel on the flange to bond thereto even after the frame has been produced in a shape corresponding to the contour of the solar-cell panel. Because of this, the frame can be integrally molded beforehand, whereby it may be freed from dimensional fluctuation caused in frame assembly or position shifting after solar-cell module fabrication, unlike conventional frames. Therefore, a solar-cell module having high dimensional accuracy can be realized.

The solar-cell panel used herein may be the same as the conventional one comprising a light-transmitting plate and solar-cell elements disposed thereon on the side opposite to the sunlight-receiving surface. Consequently, the present invention has an exceedingly high applicability.

The reactive hot-melt adhesive used for bonding the solar-cell panel to the frame, which adhesive comprises as a major component a urethane prepolymer obtained by reacting a polyhydroxy compound with an excess of a polyisocyanate compound, undergoes an abrupt increase in viscosity and solidifies upon cooling after application with heating to develop sufficient initial bonding strength. Hence, even when the solar-cell module immediately after fabrication undergoes slight vibrations caused by transport, stacking, packing, etc., the frame members do not shift from their right positions or the frame does not shift from its right position relative to the solar-cell panel. Moreover, even if the solar-cell module immediately after fabrication comes into contact with an object, the adhesive does not adhere thereto.

Furthermore, since the adhesive completely cures as a result of a curing reaction with moisture in the air to turn into a high-strength solid having rubber elasticity, it never softens even when exposed to high temperatures during storage or transport. Consequently, no frame shifting occurs and a solar-cell module excellent in heat resistance or durability can be obtained.

The process for producing the solar-cell module comprises providing a solar-cell panel having solar-cell elements disposed therein, and a frame capable of being disposed around the entire periphery of the solar-cell panel and having a flange on which the solar-cell panel is supported on the side opposite to a sunlight-receiving surface of the panel, applying onto the flange of the frame a reactive hot-melt adhesive comprising as a major component a urethane prepolymer obtained by reacting a polyhydroxy compound with an excess of a polyisocyanate compound to form an adhesive layer, followed by placing the solar-cell panel on the flange of the frame to bond the solar-cell panel with the frame via the adhesive layer. Accordingly, the frame can be produced beforehand and, hence, the solar-cell module can be produced in simple procedure. Moreover, since this frame can be produced by assembling separate frame members respectively corresponding to the peripheries of the solar-cell panel or can be integrally formed by die casting, injection molding, cutting, and the like, the cost for frame fabrication can be reduced considerably.

In addition, the frame which extends around the entire periphery of the solar-cell panel with solar-cell elements on the side opposite to the sunlight-receiving surface has a flange for supporting thereon the solar-cell panel while allowing the sunlight-receiving surface to be free, can be produced in a frame production step which is involved as a part of the solar-cell module production line prior to application of the adhesive.

While the invention has been described in detail and with reference to specific embodiments thereof, it will be apparent to one skilled in the art that various changes and modifications can be made therein without departing from the spirit and scope thereof.

What is claimed is:

1. A solar-cell module comprising:

a solar-cell panel comprising a light-transmitting plate having a first surface and a second surface opposite to the first surface, and solar-cell elements disposed on the second surface, a frame disposed around the entire periphery of the solar-cell panel and having a flange on which the solar-cell panel is supported on the second surface while the first surface is free, and an adhesive layer disposed between the second surface of the solar-cell panel and the flange of the frame, wherein said adhesive layer comprises a reactive hot-melt adhesive comprising as a major component a urethane prepolymer obtained by reacting a polyhydroxy compound with an excess amount of a polyisocyanate compound.

2. The solar-cell module of claim 1, wherein said reactive hot-melt adhesive further comprises a thermoplastic polymer.

3. The solar-cell module of claim 1, wherein said polyhydroxy compound is one or more compounds selected from polyoxyalkylene ether polyols, polyester polyols, acrylic polyols, rubber polyols including polybutadiene polyols, and castor oil derivatives.

4. The solar-cell module of claim 1, wherein said polyisocyanate compound is one or more compounds selected from diphenylmethane diisocyanate, dimethyldiphenylmethane diisocyanate, naphthalene diisocyanate, isophorone diisocyanate, cyclohexylmethane diisocyanate, tolylene diisocyanate, tetramethylene diisocyanate, hexamethylene diisocyanate, xylene diisocyanate, p-phenylene diisocyanate, trimethylolpropane adducts of polyisocyanates, and polymers of polyisocyanates.

5. A process for producing a solar-cell module comprising the steps of:

providing a solar-cell panel comprising a light-transmitting plate having a first surface and a second surface opposite to the first surface, and solar-cell elements disposed on the second surface, and a frame capable of being disposed around the entire periphery of the solar-cell panel and having a flange for supporting thereon the second surface of the solar-cell panel, applying onto the flange of the frame a reactive hot-melt adhesive comprising as a major component a urethane prepolymer obtained by reacting a polyhydroxy compound with an excess of a polyisocyanate compound to form an adhesive layer, and placing the solar-cell panel onto the adhesive layer on the flange in such a manner that the second surface contacts the adhesive layer, thereby bonding the solar-cell panel with the frame via the adhesive layer.

6. The process of claim 5, wherein said reactive hot-melt adhesive further comprises a thermoplastic polymer.

7. The process of claim 5, wherein said polyhydroxy compound is one or more compounds selected from polyoxyalkylene ether polyols, polyester polyols, acrylic polyols, rubber polyols including polybutadiene polyols, and castor oil derivatives.

8. The process of claim 5, wherein said polyisocyanate compound is one or more compounds selected from diphenylmethane diisocyanate, dimethyldiphenylmethane diisocyanate, naphthalene diisocyanate, isophorone diisocyanate, cyclohexylmethane diisocyanate, tolylene diisocyanate, tetramethylene diisocyanate, hexamethylene diisocyanate, xylene diisocyanate, p-phenylene diisocyanate, trimethylolpropane adducts of polyisocyanates, and polymers of polyisocyanates.

* * * * *